United States Patent
Takai

(10) Patent No.: US 10,018,904 B2
(45) Date of Patent: Jul. 10, 2018

(54) EUV MASK AND METHOD FOR MANUFACTURING SAME

(71) Applicant: Toshiba Memory Corporation, Tokyo (JP)

(72) Inventor: Kosuke Takai, Kanagawa (JP)

(73) Assignee: Toshiba Memory Corporation, Tokyo (JP)

( * ) Notice: Subject to any disclaimer, the term of this patent is extended or adjusted under 35 U.S.C. 154(b) by 47 days.

(21) Appl. No.: 15/069,482

(22) Filed: Mar. 14, 2016

(65) Prior Publication Data

US 2017/0038671 A1    Feb. 9, 2017

(30) Foreign Application Priority Data

Aug. 4, 2015    (JP) .................................. 2015-154157

(51) Int. Cl.
    *G03F 1/24*    (2012.01)
    *G03F 1/22*    (2012.01)

(52) U.S. Cl.
CPC . *G03F 1/22* (2013.01); *G03F 1/24* (2013.01)

(58) Field of Classification Search
None
See application file for complete search history.

(56) References Cited

U.S. PATENT DOCUMENTS

| 2004/0131947 | A1  | 7/2004 | Gallagher et al. |
| 2014/0218714 | A1* | 8/2014 | Hsu .......................... G03F 1/14 355/77 |

FOREIGN PATENT DOCUMENTS

| JP | 2003-133205   | 5/2003 |
| JP | 2010-118520   | 5/2010 |
| JP | 2011-103344 A | 5/2011 |
| JP | 2013-74268    | 4/2013 |
| JP | 5239762       | 4/2013 |
| JP | 2014-90132    | 5/2014 |

* cited by examiner

*Primary Examiner* — Stephen Rosasco
(74) *Attorney, Agent, or Firm* — Finnegan, Henderson, Farabow, Garrett & Dunner, L.L.P.

(57) ABSTRACT

An EUV mask according to an embodiment includes a substrate, a first line-shaped portion provided on the substrate, a second line-shaped portion provided on the substrate, a first sidewall disposed on a side surface of the first line-shaped portion, and a second sidewall disposed on a side surface of the second line-shaped portion. A first layer and a second layer are stacked in the first and second line-shaped portions. The first layer includes a first material. The second layer includes a second material. The first and second sidewalls include an oxide of the first material and cover a side surface of the first layer and a side surface of the second layer.

15 Claims, 9 Drawing Sheets

EUV MASK AND METHOD FOR MANUFACTURING SAME

CROSS-REFERENCE TO RELATED APPLICATIONS

This application is based upon and claims the benefit of priority from Japanese Patent Application No.2015-154157, filed on Aug. 4, 2015; the entire contents of which are incorporated herein by reference.

FIELD

Embodiments described herein relate to an EUV mask and a method for manufacturing the same.

BACKGROUND

In recent years, EUV lithography that uses EUV (Extreme Ultraviolet) as the exposure light is being developed as integrated circuits are downscaled. Because EUV has a short wavelength of about 13.5 nm (nanometers), exceedingly fine patterning is possible using EUV lithography. Because a substance that has a sufficiently high transmittance for EUV does not exist, a reflection-type mask is used when performing EUV lithography.

DETAILED DESCRIPTION

An EUV mask according to an embodiment includes a substrate, a first line-shaped portion provided on the substrate, a second line-shaped portion provided on the substrate, a first sidewall disposed on a side surface of the first line-shaped portion, and a second sidewall disposed on a side surface of the second line-shaped portion. A first layer and a second layer are stacked in the first and second line-shaped portions. The first layer includes a first material. The second layer includes a second material. The first and second sidewalls include an oxide of the first material and cover a side surface of the first layer and a side surface of the second layer.

A method for manufacturing an EUV mask according to an embodiment includes forming a resist pattern on a blank material. The blank material includes a substrate and a multilayer film provided on the substrate. The resist pattern includes a first line-shaped portion and a second line-shaped portion. A first layer and a second layer are stacked in a multilayer film. The method includes patterning the multilayer film using the resist pattern as a mask. The method includes performing oxidation treatment of the patterned multilayer film.

FIRST EMBODIMENT

First, a first embodiment will be described.

An EUV mask according to the embodiment is used in lithography using EUV as the exposure light, and is a mask for lithography when manufacturing a microstructure body. The microstructure body includes, for example, an integrated circuit such as an LSI (Large Scale Integrated) circuit, a memory device, a substrate circuit of a display, or the like, a MOSFET (Metal-Oxide-Semiconductor Field-Effect Transistor), an IGBT (Insulated Gate Bipolar Transistor), a discrete device such as an LED (Light Emitting Diode) or the like, MEMS (Micro Electro Mechanical Systems), etc.

Figure 1A:
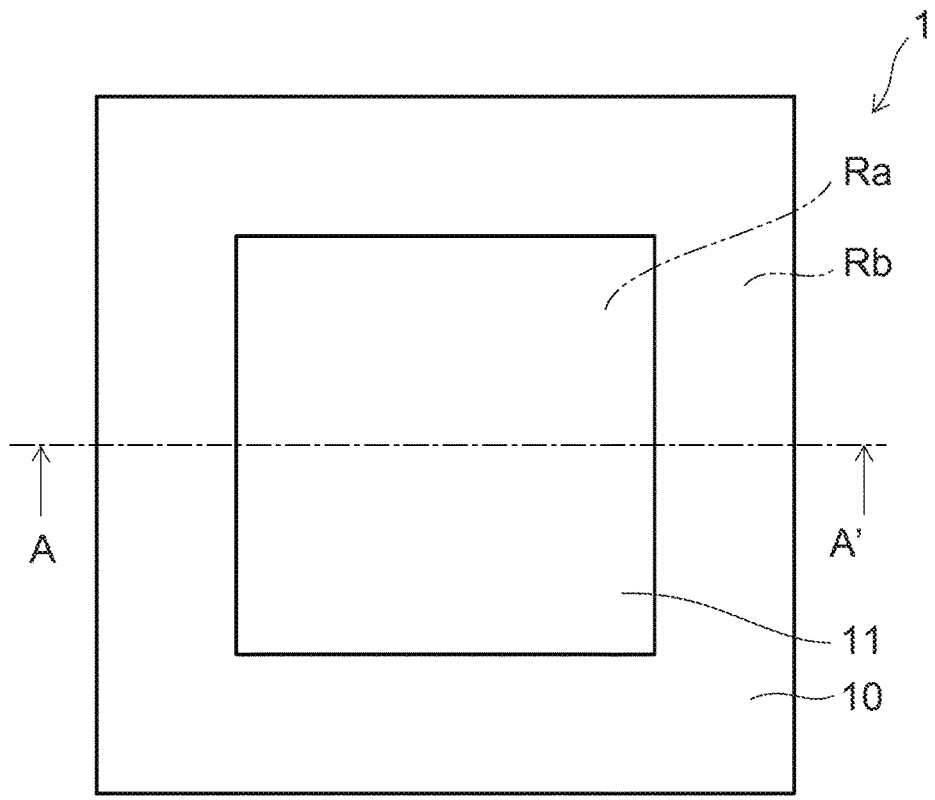
FIG. 1A is a plan view showing an EUV mask according to a first embodiment.
Figure 1B:
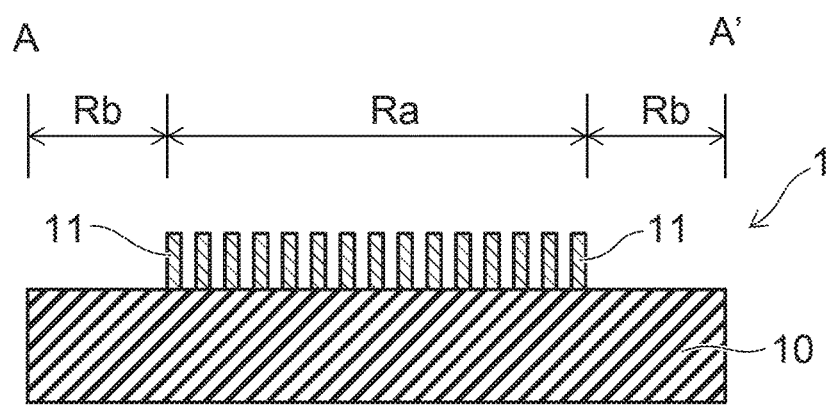
FIG. 1B is a cross-sectional view along line A-A' of FIG. 1A.

FIG. 1A is a plan view showing the EUV mask according to the embodiment; and FIG. 1B is a cross-sectional view along line A-A' of FIG. 1A.

Figure 2A:
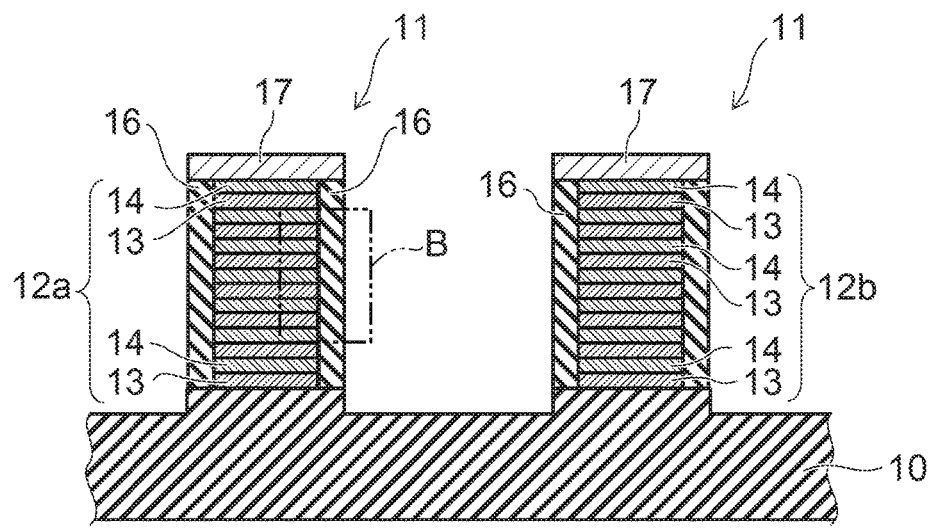
FIG. 2A is a cross-sectional view showing a pattern structure body of the EUV mask according to the first embodiment.
Figures 2B, 2C:
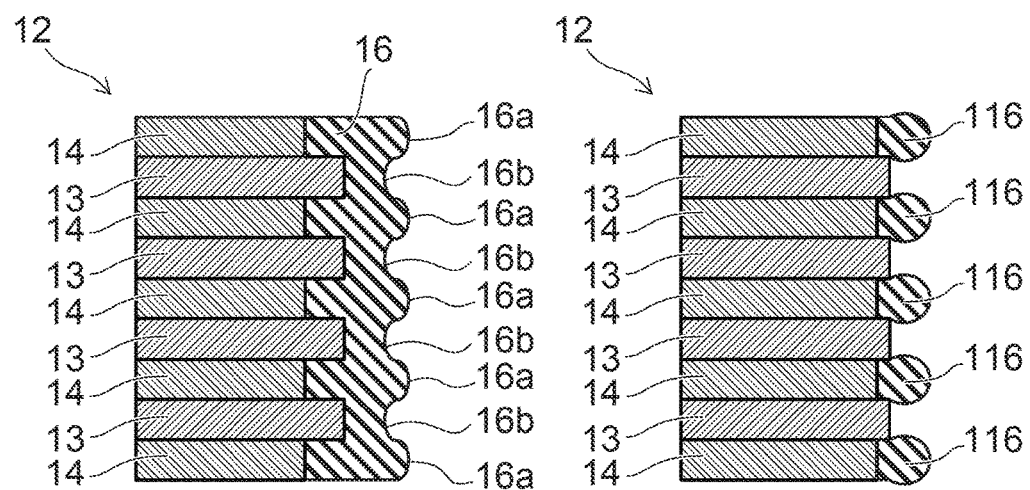
FIG. 2B is a partially-enlarged cross-sectional view showing region B of FIG. 2A.
FIG. 2C is a reference drawing corresponding to FIG. 2B.

FIG. 2A is a cross-sectional view showing a pattern structure body of the EUV mask according to the embodiment; FIG. 2B is a partially-enlarged cross-sectional view showing region B of FIG. 2A; and FIG. 2C is a reference drawing corresponding to FIG. 2B.

All of the following drawings are schematic; and the dimensional ratios of the components are not necessarily precise to give priority to easier viewing. Also, the numbers of multiply-existing components are reduced in the illustrations.

As shown in FIG. 1A, a substrate 10 is provided in the EUV mask 1 according to the embodiment. The substrate 10 is made of glass having an extremely small coefficient of thermal expansion; and the configuration of the substrate 10 is, for example, a rectangular plate configuration. When viewed from above, the length of one side of the substrate 10 is about 100 to 200 mm (millimeters). When viewed from above, an exposed region Ra is set in the central portion of the substrate 10. The configuration of the exposed region Ra is, for example, a square; and the length of one side of the exposed region Ra is several tens of mm. A peripheral region Rb is set in the peripheral portion of the substrate 10. The configuration of the peripheral region Rb is a frame-like configuration provided around the exposed region Ra.

As shown in FIG. 1B, pattern structure bodies 11 are provided on the substrate 10 in the exposed region Ra. The pattern structure body 11 is, for example, included in a pattern corresponding to a patterning pattern, e.g., a circuit pattern of an integrated circuit, for manufacturing by EUV lithography using the EUV mask 1. The pattern of the pattern structure body 11 is similar to the patterning pattern and is an enlarged pattern of the patterning pattern. On the other hand, the pattern structure body 11 is not provided in the peripheral region Rb. The pattern structure body 11 may be provided in the peripheral region Rb.

As shown in FIG. 2A, a multilayer film 12 is provided on the substrate 10 in the pattern structure body 11. A molybdenum layer 13 that is made of molybdenum (Mo) and a silicon layer 14 that is made of silicon (Si) are stacked alternately in the multilayer film 12. For example, about 40 pairs made of the molybdenum layer 13 and the silicon layer 14 are provided. The multilayer film 12 is patterned into the patterning pattern. The multilayer film 12 includes at least two line-shaped portions, i.e., line-shaped portions 12a and 12b. Each of the line-shaped portions 12a and 12b is a portion extending in one direction parallel to the upper surface of the substrate 10 and is a portion corresponding to one interconnect of the patterning pattern. The molybdenum layer 13 and the silicon layer 14 are stacked alternately in the line-shaped portions 12a and 12b.

A sidewall 16 is provided on the side surfaces of portions of the multilayer film 12, e.g., on the two side surfaces of the line-shaped portion 12a and on the two side surfaces of the line-shaped portion 12b. The "portions of the multilayer film 12" are portions interposed between the patterned surfaces of the multilayer film 12 after the patterning and refer to portions that do not include any regions in their interiors where the multilayer film 12 does not exist. For example, the line-shaped portions 12a and 12b described above are included in the portions of the multilayer film 12. The sidewall 16 is a continuous film formed of silicon oxide; and the average thickness of the sidewall 16 is, for example, about 10 nm. The sidewall 16 covers both the side surfaces of the molybdenum layers 13 and the side surfaces of the silicon layers 14. The composition of the sidewall 16 is $SiO_x$; and x is, for example, about 1.3. For example, a capping layer 17 made of ruthenium (Ru) is provided on the multilayer film 12 and on the sidewall 16 provided on the two side surfaces of the multilayer film 12. The pattern structure body 11 includes the multilayer film 12, the sidewall 16, and the capping layer 17. The capping layer 17 may not be provided.

The region of the upper surface of the substrate 10 in contact with the pattern structure body 11 is positioned slightly lower than the region of the upper surface of the substrate 10 not in contact with the pattern structure body 11. In other words, the portions of the substrate 10 between the pattern structure bodies 11 are slightly dug out. The substrate 10 may not be dug out.

As shown in FIG. 2B, the region of the side surface of the multilayer film 12 made of the silicon layers 14 is recessed more than the region of the side surface of the multilayer film 12 made of the molybdenum layers 13. Thereby, the configuration of the side surface of the multilayer film 12 is a wave-like configuration having a period equal to the stacking period of the multilayer film 12. The portion of the sidewall 16 disposed on the side surfaces of the silicon layers 14 is thicker than the portion of the sidewall 16 disposed on the side surfaces of the molybdenum layers 13. Therefore, the configuration of the surface of the sidewall 16 is a wave-like configuration corresponding to the stacking of the silicon layers 14 and the molybdenum layers 13. In other words, the regions of the surface of the sidewall 16 corresponding to the silicon layers 14 are protrusions 16a; and the regions of the surface of the sidewall 16 corresponding to the molybdenum layers 13 are recesses 16b.

As described below, the sidewall 16 is formed by performing oxidation treatment of the silicon layers 14. As a reference example, FIG. 2C shows an example in which the sidewall 16 is not provided on the side surface of the multilayer film 12, and a native oxide film 116 of the silicon layers 14 exists. The average thickness of the native oxide film 116 is, for example, 2 to 3 nm; the native oxide film 116 is formed only on the side surfaces of the silicon layers 14; and the native oxide film 116 substantially does not cover the side surfaces of the molybdenum layers 13. Therefore, the native oxide film 116 is a discontinuous film. Thus, the sidewall 16 is a continuous film having an average thickness of, for example, about 10 nm; the native oxide film 116 is a discontinuous film having an average thickness of 2 to 3 nm; and the two are different from each other.

A method for manufacturing the EUV mask according to the embodiment will now be described.

Figure 3:
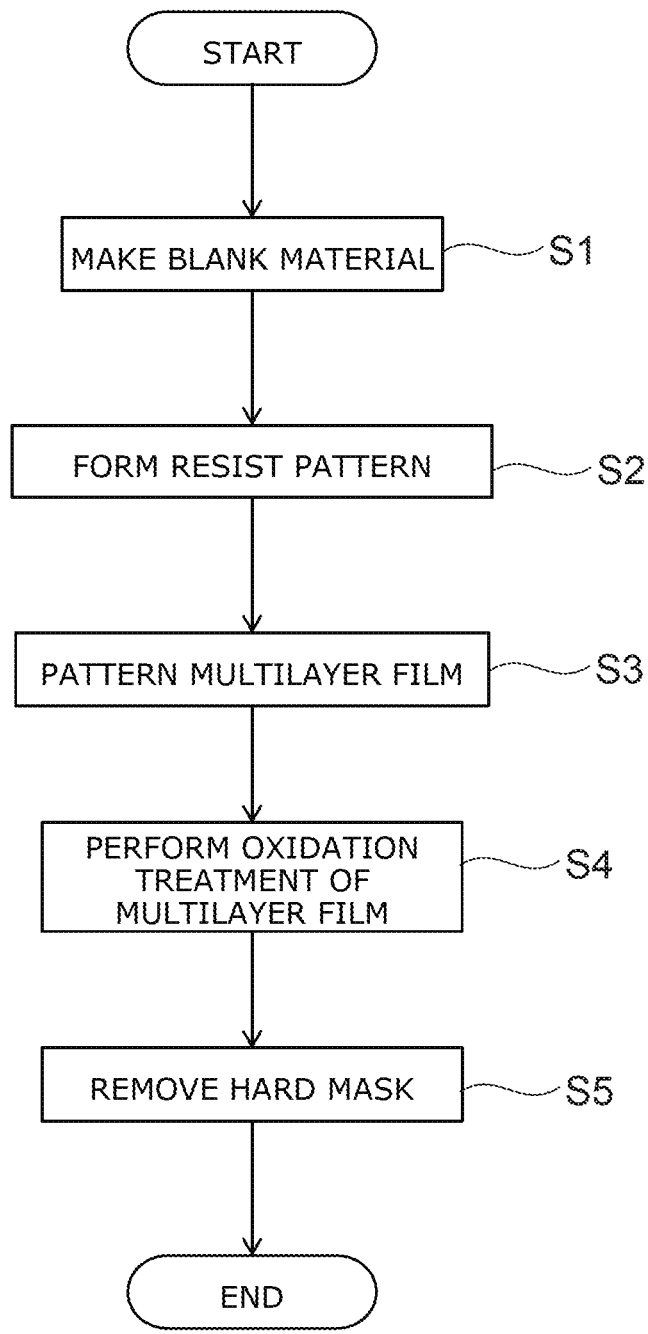
FIG. 3 is a flowchart showing a method for manufacturing an EUV mask according to the first embodiment.

FIG. 3 is a flowchart showing the method for manufacturing the EUV mask according to the embodiment.

Figure 4A:
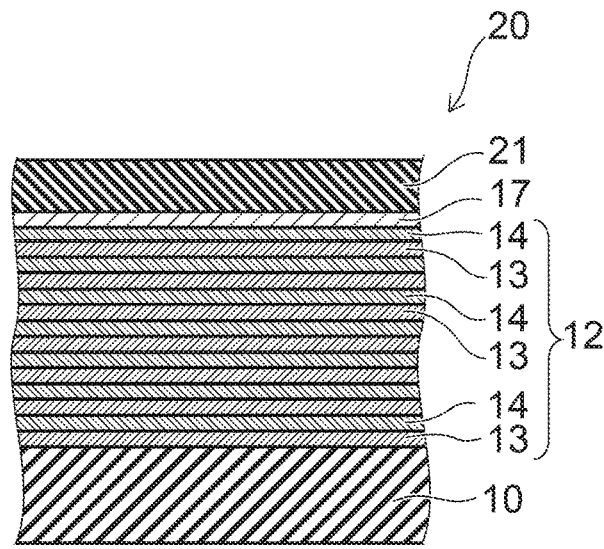
FIGS. 4A to 4C are cross-sectional views showing the method for manufacturing the EUV mask according to the first embodiment.
Figure 4B:
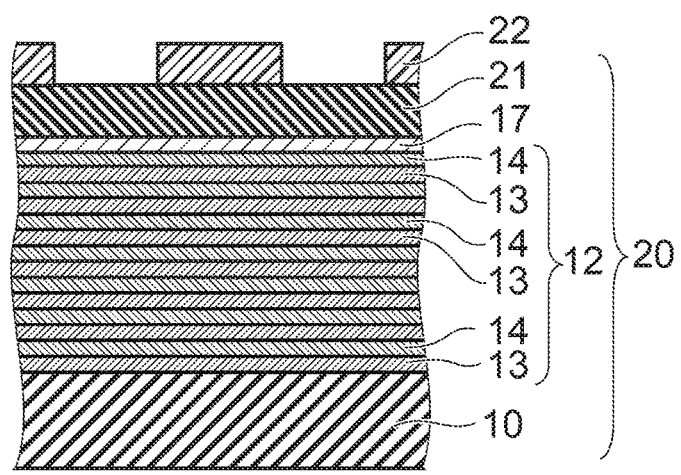
Figure 4C:
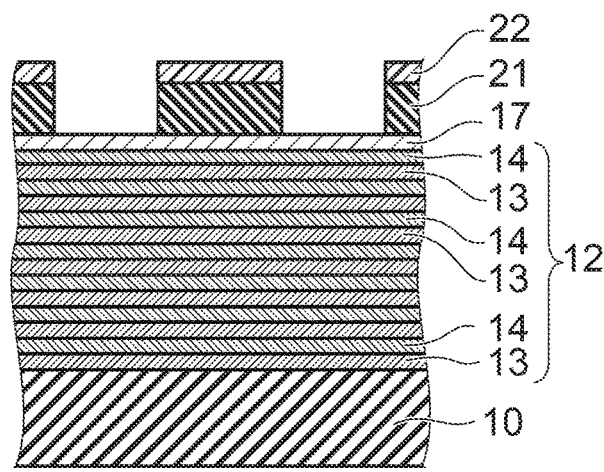

FIGS. 4A to 4C are cross-sectional views showing the method for manufacturing the EUV mask according to the embodiment.

Figure 5A:
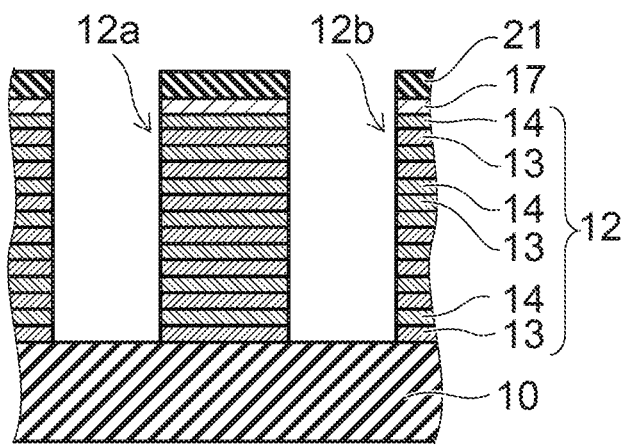
FIGS. 5A to 5C are cross-sectional views showing the method for manufacturing the EUV mask according to the first embodiment.
Figure 5B:
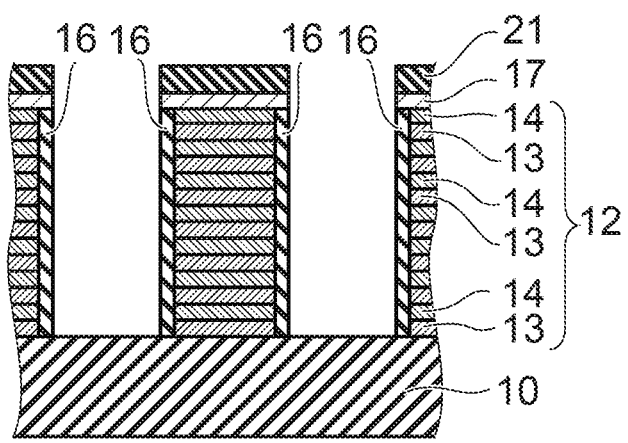
Figure 5C:
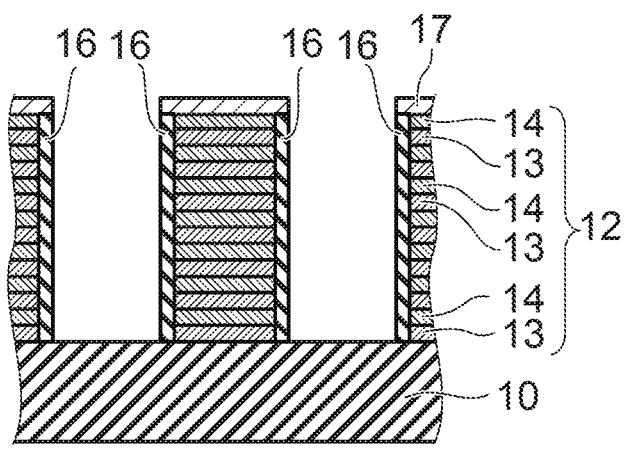

FIGS. 5A to 5C are cross-sectional views showing the method for manufacturing the EUV mask according to the embodiment.

First, as shown in step S1 of FIG. 3 and in FIG. 4A, a blank material 20 of an EUV mask is made. Specifically, the substrate 10 that is made of glass having an extremely small coefficient of thermal expansion is prepared; and, for example, the multilayer film 12 in which the molybdenum layer 13 and the silicon layer 14 are stacked alternately is formed on the substrate 10 by sputtering. The number of stacks of the molybdenum layer 13 and the silicon layer 14 is, for example, about 40 layers each; and the uppermost layer is the silicon layer 14. Then, the capping layer 17 is formed by depositing ruthenium. Continuing, a hard mask 21 that has a two-layer structure is formed by forming a TaN layer made of tantalum nitride and forming a TaO layer made of tantalum oxide. Thereby, the blank material 20 is made.

Then, as shown in step S2 of FIG. 3 and in FIG. 4B, a resist pattern 22 is formed on the blank material 20. Specifically, a resist film is formed on the upper surface of the blank material 20 by coating a positive-type chemically amplified resist. Then, a pattern that corresponds to the patterning pattern described above is drawn by selectively irradiating an electron beam on the resist film using an electron beam lithography apparatus. Continuing, the portion of the resist film irradiated with the electron beam is removed by performing PEB (Post Exposure Bake) and developing. Thereby, the resist pattern 22 is formed.

Then, as shown in step S3 of FIG. 3, the multilayer film 12 is patterned using the resist pattern 22.

Specifically, as shown in FIG. 4C, the pattern of the resist pattern 22 is transferred onto the hard mask 21 by performing plasma etching using the resist pattern 22 as a mask.

Then, as shown in FIG. 5A, the pattern of the hard mask 21 is transferred onto the multilayer film 12 by selectively removing the multilayer film 12 by performing plasma etching using the hard mask 21 as a mask. At this time, the substrate 10 is exposed in the region where the multilayer film 12 is removed. In the case where over-etching is performed to reliably remove the multilayer film 12, the substrate 10 in the region not covered with the hard mask 21 may be dug out. Thus, the multilayer film 12 is patterned into a pattern corresponding to the patterning pattern. At this time, the line-shaped portions 12a and 12b are formed as portions of the patterned multilayer film 12.

Then, as shown in step S4 of FIG. 3 and in FIG. 5B, the side surfaces of portions of the patterned multilayer film 12 are oxidized. For example, laser light is irradiated on the multilayer film 12 in ambient air or in an atmosphere containing oxygen. Thereby, the multilayer film 12 is heated; and the side surfaces of the multilayer film 12 exposed to the atmosphere are oxidized. The oxidation treatment of the multilayer film 12 is not limited to this method. For example, the oxidation treatment may be performed by irradiating an electron beam instead of laser light, performing oxidation treatment by plasmatizing oxygen gas inside a reduced-pressure container, or by immersing in a chemical liquid having oxidizing capability.

As shown in FIG. 2B, a portion of the silicon layer 14 is oxidized from the side surface side of the multilayer film 12 by the oxidation treatment to become silicon oxide. Because the volume of the silicon of the silicon layer 14 expands when changing to silicon oxide by the oxidation, the silicon oxide juts above and below the silicon layer 14 to cover the side surfaces of the molybdenum layers 13 and form a continuous silicon oxide film. As a result, the sidewall 16 that is made of silicon oxide is formed on the side surface of the multilayer film 12. At this time, the widths of the portions of the multilayer film 12 decrease by the amount that is oxidized.

Then, the hard mask 21 is removed as shown in step S5 of FIG. 3 and in FIG. 5C. Thus, the EUV mask 1 according to the embodiment is manufactured.

Effects of the embodiment will now be described.

In the EUV mask 1 according to the embodiment, the multilayer film 12 is patterned into a pattern corresponding to the patterning circuit pattern by selectively removing the multilayer film 12. Thereby, the irradiated EUV is reflected in the region where the multilayer film 12 remains; and the irradiated EUV is not reflected in the region where the multilayer film 12 does not exist. As a result, the EUV mask 1 selectively reflects the EUV; and the EUV can be selectively irradiated on the resist film formed on the wafer which is the patterning material.

Because the EUV mask is a reflective mask, when exposing using the EUV mask, the EUV that is from a direction tilted about 6 degrees with respect to the normal direction of the EUV mask is incident. Because a light-absorbing body is not formed on the capping layer 17 in the EUV mask 1 according to the embodiment, the shadow of the light-absorbing body does not occur; and errors due to the shadow do not occur in the pattern projected onto the wafer.

The effects will now be described in detail by comparing to a comparative example.

Figure 6A:
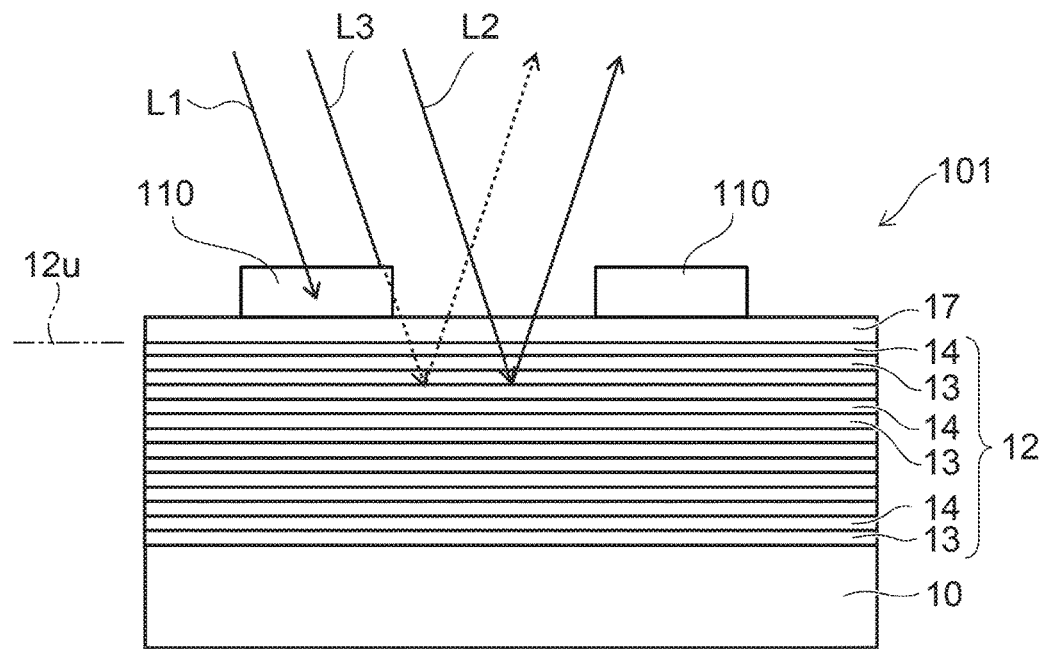
FIG. 6A is an optical model diagram showing an EUV mask according to a comparative example.
Figure 6B:
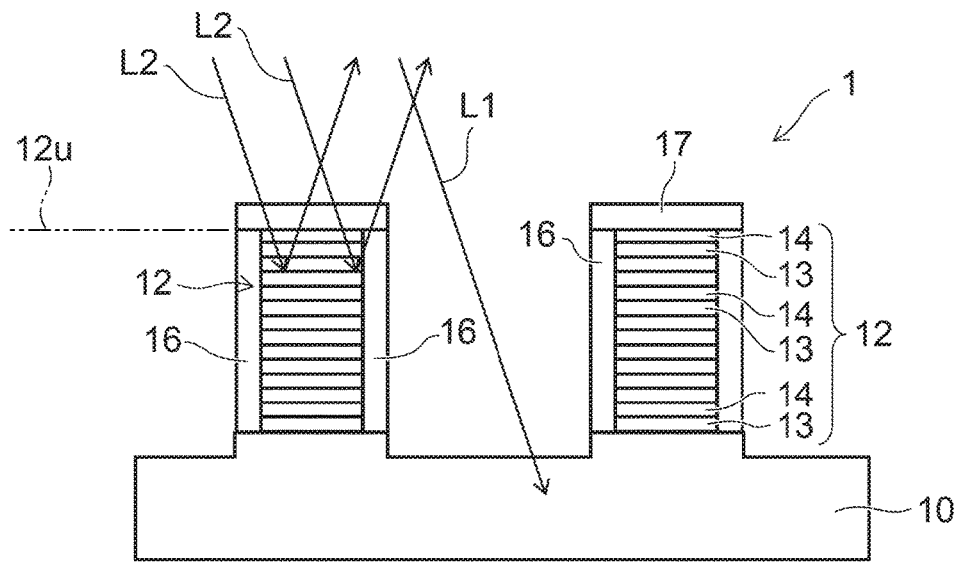
FIG. 6B is an optical model diagram showing the EUV mask according to the first embodiment.

FIG. 6A is an optical model diagram showing an EUV mask according to the comparative example; and FIG. 6B is an optical model diagram showing the EUV mask according to the embodiment.

In the EUV mask 101 according to the comparative example as shown in FIG. 6A, the multilayer film 12 and the capping layer 17 are provided on the entire surface and are not patterned. A light-absorbing body 110 that is patterned into a pattern corresponding to the patterning pattern is provided on the capping layer 17. For example, the light-absorbing body 110 is made of a metal such as tantalum (Ta), etc., and absorbs EUV.

Thereby, EUV light L1 that is incident on the light-absorbing body 110 of the EUV mask 101 is absorbed by the light-absorbing body 110 and is not reflected. On the other hand, EUV light L2 that is incident on the multilayer film 12 is reflected by the multilayer film 12. Thereby, the EUV mask 101 can selectively reflect the EUV that is incident.

However, it is necessary for the light-absorbing body 110 to be somewhat thick to realize good contrast; and as a result, a region occurs where a shadow of the light-absorbing body 110 forms undesirably on an upper surface 12u of the multilayer film 12. In the example shown in FIG. 6A, when using the upper surface 12u of the multilayer film 12 as a reference, EUV light L3 is incident on the light reflecting region and should be reflected by the multilayer film 12, but actually is incident on the light-absorbing body 110 and is undesirably absorbed. Therefore, an error undesirably occurs between the pattern that is formed in the EUV mask 101 and the pattern that is formed on the wafer. This is called the shadowing effect.

The shadowing effect appears markedly for patterns of interconnects extending in a direction orthogonal to the tilt direction when the incident direction of the EUV is tilted with respect to the normal of the EUV mask; and the shadowing effect appears slightly for patterns of interconnects extending in a direction parallel to the tilt direction. As a result, the deformation of the pattern formed on the wafer with respect to the pattern formed in the EUV mask is large; and the precision of the lithography decreases.

Conversely, in the EUV mask 1 according to the embodiment as shown in FIG. 6B, the EUV light L2 that is incident on the upper surface 12u of the multilayer film 12 is reflected without being incident on the upper surface 12u of the multilayer film 12; and the EUV light L1 that is incident on the substrate 10 or the side surfaces of the multilayer film 12 is not reflected. Thus, because the light-absorbing body that may form a shadow does not exist on the upper surface 12u of the multilayer film 12 in the EUV mask 1, the shadowing effect does not occur; and the precision of the lithography is high.

In the EUV mask 1 according to the embodiment, the sidewall 16 is provided on the side surfaces of portions of the multilayer film 12. The sidewall 16 is a strong continuous film made of silicon oxide. Thereby, the degradation of the multilayer film 12 caused by change over time and mask cleaning can be suppressed. Accordingly, the dimensional precision of the EUV mask 1 does not decrease easily, even over use. As a result, by transferring the pattern onto a patterning material such as a wafer, etc., and by performing a lithography process using the EUV mask 1, a pattern having exceedingly high dimensional precision can be formed; and the yield of the microstructure body manufactured using the EUV mask 1 is high.

SECOND EMBODIMENT

A second embodiment will now be described.

Figure 7A:
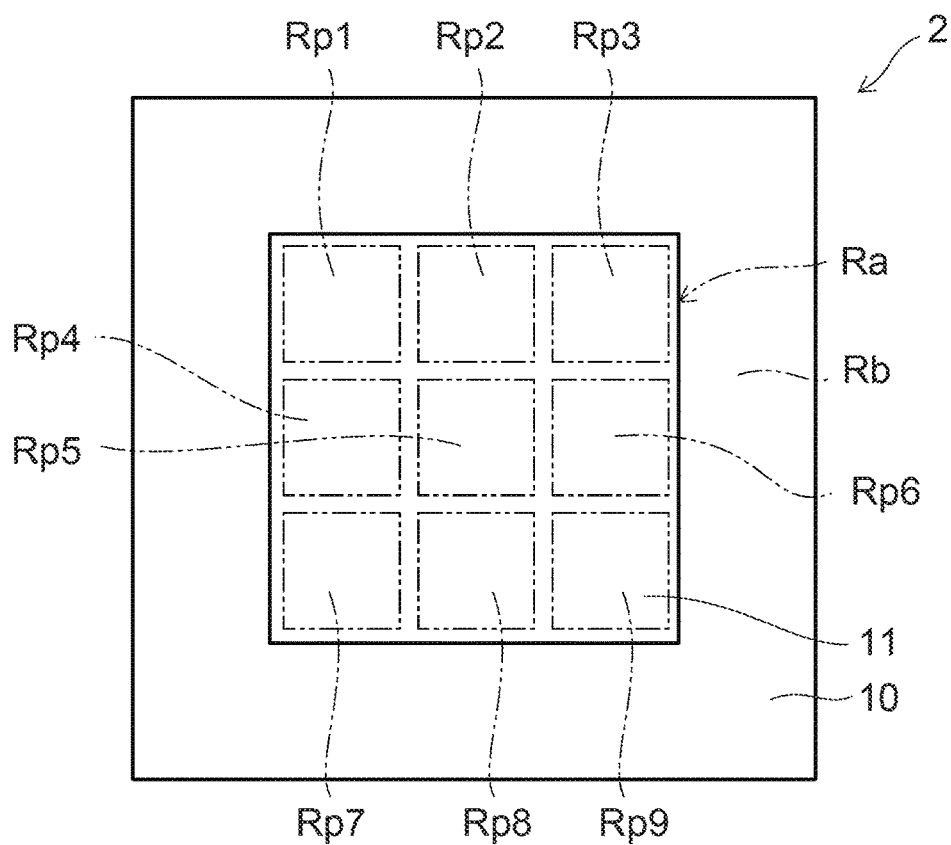
FIG. 7A is a plan view showing an EUV mask according to a second embodiment.
Figure 7B:
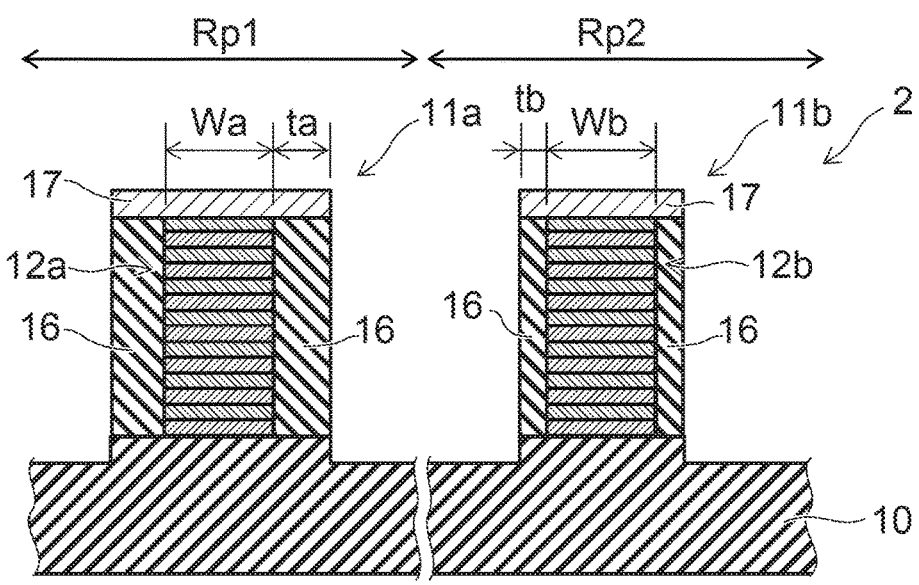
FIG. 7B is a cross-sectional view of the EUV mask.

FIG. 7A is a plan view showing an EUV mask according to the embodiment; and FIG. 7B is a cross-sectional view of the EUV mask.

As shown in FIG. 7A, multiple, e.g., nine, unit regions Rp1 to Rp9 are set inside the exposed region Ra in the EUV mask 2 according to the embodiment. The pattern of the multilayer film 12 is the same in each of the unit regions. The unit regions correspond respectively to integrated circuits formed on a wafer. Therefore, by using the EUV mask 2, the same integrated circuit can be formed multiply and simultaneously in the wafer.

As shown in FIG. 7B, a portion 11a of the pattern structure body 11 formed inside the unit region Rp1 of the EUV mask 2 and a portion 11b of the pattern structure body 11 formed inside a unit region Rp2 correspond to the same position of the patterning pattern to be made. The line-shaped portion 12a of the multilayer film 12 is included in the portion 11a; and the line-shaped portion 12b of the multilayer film 12 is included in the portion 11b. A thickness ta of the sidewall 16 for the portion 11a is thicker than a thickness tb of the sidewall 16 for the portion 11b. In other words, ta>tb. A width Wa of the line-shaped portion 12a of the multilayer film 12 for the portion 11a is substantially equal to a width Wb of the line-shaped portion 12b of the multilayer film 12 for the portion 11b. In other words, Wa≈Wb. Therefore, the absolute value |ta−tb| of the difference between the thickness ta of the sidewall 16 for the portion 11a and the thickness tb of the sidewall 16 for the portion 11b is greater than the absolute value |Wa−Wb| of the difference between the width Wa of the multilayer film 12 for the portion 11a and the width Wb of the multilayer film 12 for the portion 11b. In other words, |ta−tb|>|Wa−Wb|. A similar relationship holds between portions of the patterning pattern corresponding to any same position of the patterning pattern in any two unit regions.

A method for manufacturing the EUV mask according to the embodiment will now be described.

Figure 8:
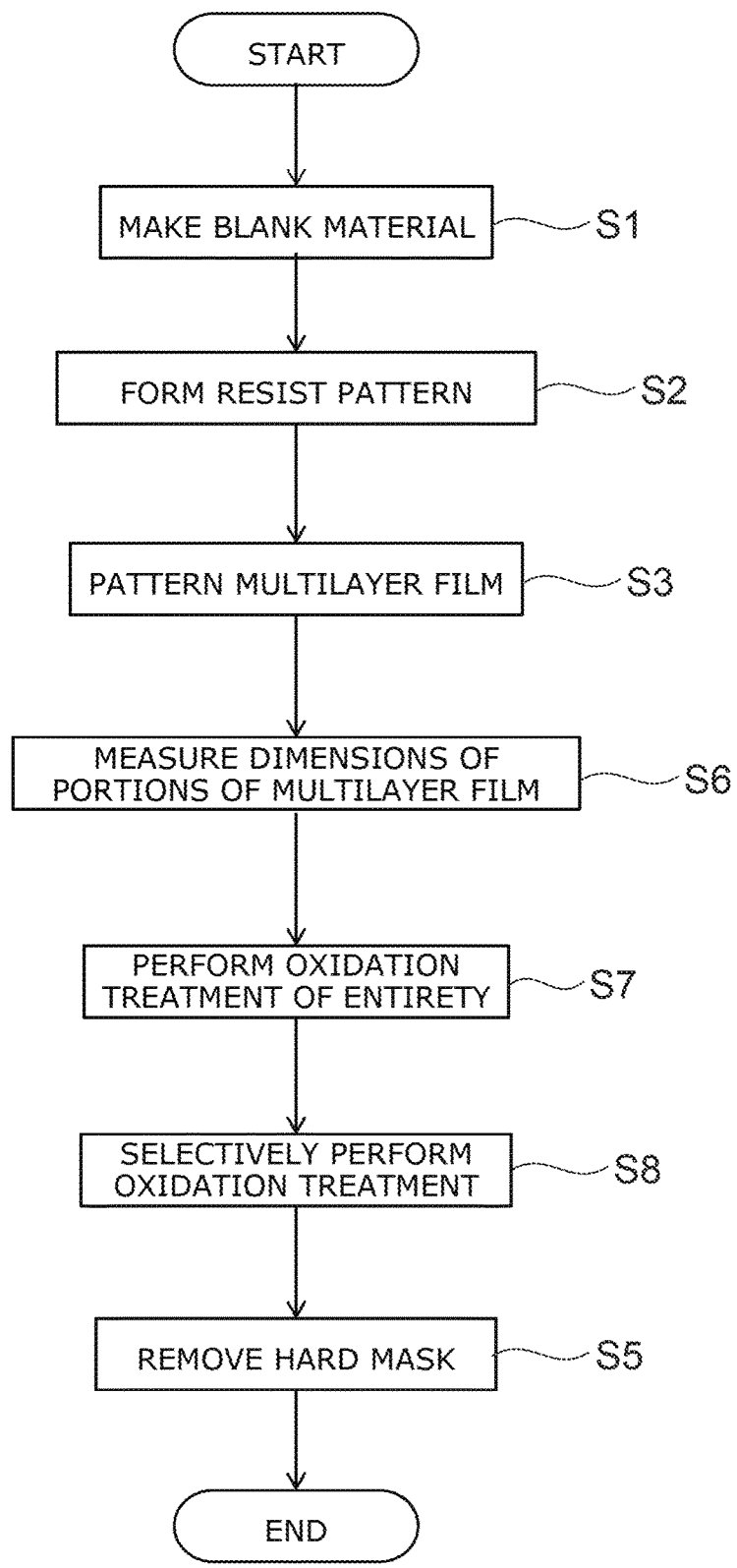
FIG. 8 is a flowchart showing a method for manufacturing an EUV mask according to the second embodiment.

FIG. 8 is a flowchart showing the method for manufacturing the EUV mask according to the embodiment.

Figure 9:
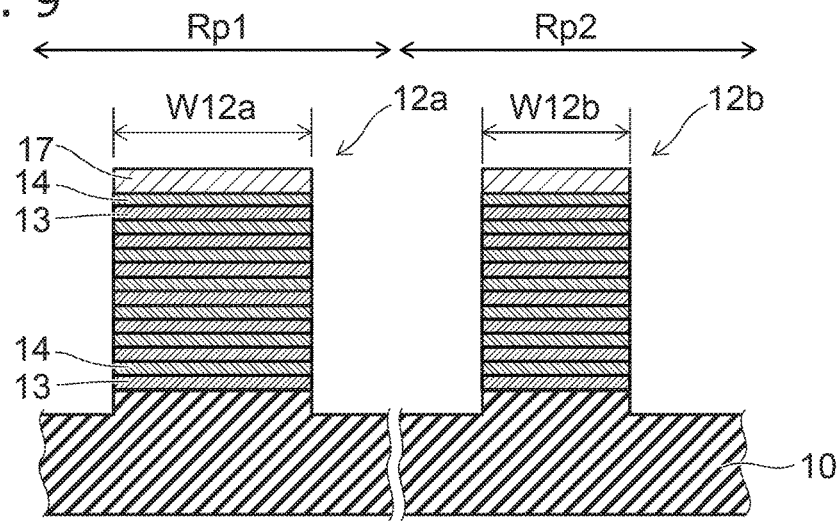
FIG. 9 is a cross-sectional view showing the method for manufacturing the EUV mask according to the second embodiment.

FIG. 9 is a cross-sectional view showing the method for manufacturing the EUV mask according to the embodiment.

Figure 10:
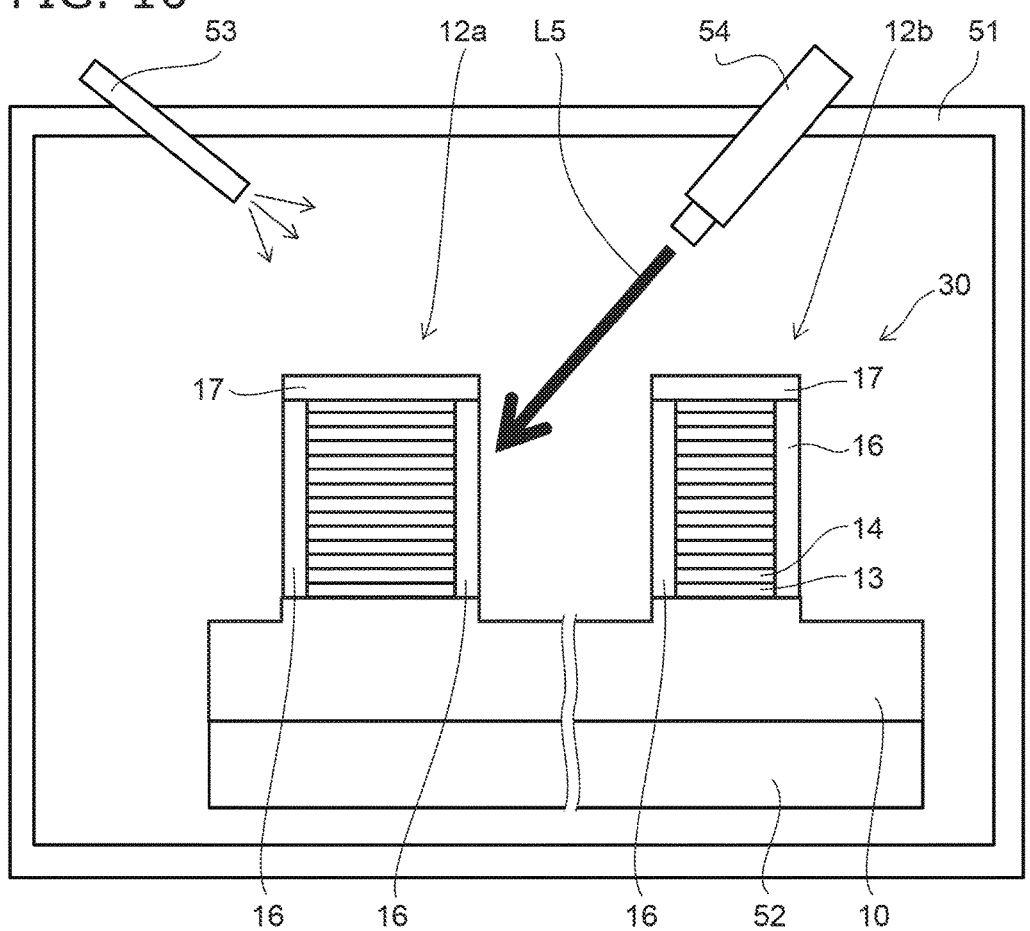
FIG. 10 shows a selective oxidation treatment process of the second embodiment.

FIG. 10 shows a selective oxidation treatment process of the embodiment.

The portions of the EUV mask shown in FIG. 9 and FIG. 10 correspond to the portions shown in FIG. 7B.

First, by a method similar to that of the first embodiment described above as shown in steps S1 to S3 of FIG. 8, the blank material 20 is made; the resist pattern 22 is formed on the blank material 20; and the multilayer film 12 is patterned using the resist pattern 22.

Then, as shown in step S6 of FIG. 8, the dimensions of the portions of the patterned multilayer film 12 are measured. For example, the measurement is performed by imaging the multilayer film 12 from above using a SEM (Scanning Electron Microscope). Thereby, the dimension distribution result of the patterned multilayer film 12 is acquired.

As a result, as shown in FIG. 9, it is taken that the width of the line-shaped portion is different between the line-shaped portion 12a of the multilayer film 12 in the unit region Rp1 and the line-shaped portion 12b of the multilayer film 12 in the unit region Rp2. The line-shaped portion 12a and the line-shaped portion 12b are portions corresponding to the same position of the patterning pattern and have the same width design value. In such a case, for example, it is taken that a width W12a of the line-shaped portion 12a is greater than the design value due to the process error, and a width W12b of the line-shaped portion 12b is within the tolerance range of the design value.

Then, as shown in step S7 of FIG. 8, the entire side surfaces of the patterned multilayer film 12 are oxidized uniformly. For example, the oxidization is performed by plasma oxidation treatment. The oxidation treatment may be performed by immersing in a chemical liquid having oxidizing capability. Thereby, the sidewall 16 that is made of silicon oxide is formed on the side surfaces of the portions of the multilayer film 12 to have a substantially uniform thickness. In other words, the thickness is within a constant range; and a continuous film is formed to cover the side surfaces of the molybdenum layers 13 and the silicon layers 14. That is, a film that covers the entire side surfaces of the multilayer film 12 is formed. The thickness of the film is substantially the same between the portions of the multilayer film 12.

Then, as shown in step S8 of FIG. 8, oxidation treatment is performed selectively for the portion, e.g., the line-shaped portion 12a, of the portions of the multilayer film 12 determined to have the width greater than the design value in the dimension measurement process shown in step S6. For example, the selective oxidation treatment is performed by selectively irradiating laser light in an oxidation atmosphere.

Specifically, as shown in FIG. 10, an intermediate structure body 30 that includes the multilayer film 12 and the capping layer 17 formed on the substrate 10 and the sidewall 16 formed to have the uniform thickness on the side surfaces of the multilayer film 12 is placed inside a chamber 51 and held by a movable stage 52. Then, laser light L5 is irradiated on the line-shaped portion 12a by a laser light source 54 while introducing an oxidizing specie, e.g., oxygen gas, into the chamber 51 via a nozzle 53. Thereby, the line-shaped portion 12a is selectively heated; the side surface of the line-shaped portion 12a is oxidized further; and the thickness of the sidewall 16 on the side surface of the line-shaped portion 12a increases. At this time, the irradiation time or irradiation intensity of the laser light L5 is controlled based on the dimension distribution result acquired in the dimension measurement process shown in step S6. Thereby, the thickness of the sidewall 16 can have any planar distribution.

Thus, because the line-shaped portion 12a having the width of the multilayer film 12 that is greater than the design value is oxidized more intensely compared to the line-shaped portion 12b having the width of the design value, the sidewall 16 is formed to be thicker; and the reduction amount of the width of the multilayer film 12 is increased by this amount by the oxidization. As a result, the width of the line-shaped portion 12a approaches the width of the line-shaped portion 12b. Thereby, as shown in FIG. 7B, the widths Wa and Wb of the portions of the multilayer film 12 corresponding to the same position of the patterning pattern are substantially equal to each other. In other words, Wa≈Wb after forming the sidewall 16 even in the case where W12a>W12b prior to forming the sidewall 16. As a result, the effective dimensional precision for EUV increases.

Then, the hard mask 21 is removed as shown in step S5 of FIG. 8. Thus, the EUV mask 2 according to the embodiment is manufactured.

Effects of the embodiment will now be described.

According to the embodiment, the widths of the portions of the multilayer film 12 are measured in the process shown in step S6 of FIG. 8; and oxidation treatment is performed additionally for the portion where the width is greater than the design value in the process shown in step S8. Thereby, the widths of the portions of the multilayer film 12 approach the design value; and the dimensional precision can be increased.

Otherwise, the configuration, the manufacturing method, and the effects of the embodiment are similar to those of the first embodiment described above.

Although an example is illustrated in the embodiment in which only the portion where the width is greater than the design value is selectively oxidized in the process shown in step S8 after uniformly oxidizing the side surfaces of the multilayer film 12 in the process shown in step S7 of FIG. 8, this is not limited thereto; and the thickness of the sidewall 16 may be provided with a distribution to cause the width of the multilayer film 12 to approach the design value by performing the oxidation treatment once by controlling the irradiation time or irradiation intensity of the laser light based on the dimension distribution result.

Although an example is illustrated in the embodiments described above in which the hard mask 21 is removed after performing the oxidation treatment of the multilayer film 12, this is not limited thereto; and the oxidation treatment may be performed after removing the hard mask 21.

According to the embodiments described above, an EUV mask and a method for manufacturing the EUV mask that provide high durability and high precision of a pattern formed in a patterning material can be realized.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. An EUV mask, comprising:
a substrate;
a first line-shaped portion provided on the substrate, a first layer and a second layer being stacked in the first line-shaped portion, the first layer including a first material, the second layer including a second material;
a second line-shaped portion provided on the substrate, a first layer and a second layer being stacked in the second line-shaped portion, the first layer including the first material, the second layer including the second material;
a first sidewall disposed on a side surface of the first line-shaped portion, the first sidewall including an oxide of the first material and covering a side surface of the first layer and a side surface of the second layer; and
a second sidewall disposed on a side surface of the second line-shaped portion, the second sidewall including the oxide of the first material and covering a side surface of the first layer and a side surface of the second layer,
wherein a portion of the first sidewall disposed on the side surface of the first layer is thicker than a portion of the first sidewall disposed on the side surface of the second layer.

2. The EUV mask according to claim 1, wherein
the first sidewall is a continuous film covering the side surface of the first line-shaped portion, and
the second sidewall is a continuous film covering the side surface of the second line-shaped portion.

3. The EUV mask according to claim 1, wherein a configuration of a surface of the first sidewall is a wave-like configuration corresponding to the stacking of the first layer and the second layer.

4. The EUV mask according to claim 1, wherein the absolute value of a difference between a thickness of the first sidewall and a thickness of the second sidewall is greater than the absolute value of a difference between a width of the first line-shaped portion and a width of the second line-shaped portion.

5. The EUV mask according to claim 4, wherein
a first region and a second region corresponding to a same patterning pattern are set, and
the first line-shaped portion is disposed inside the first region, the second line-shaped portion is disposed inside the second region, and the first line-shaped portion and the second line-shaped portion correspond to the same position of the patterning pattern.

6. The EUV mask according to claim 1, wherein the first material is silicon.

7. The EUV mask according to claim 1, wherein the second material is molybdenum.

8. An EUV mask, comprising:
a substrate;
a first line-shaped portion provided on the substrate, a first layer and a second layer being stacked in the first line-shaped portion, the first layer including a first material, the second layer including a second material;
a second line-shaped portion provided on the substrate, a first layer and a second layer being stacked in the second line-shaped portion, the first layer including the first material, the second layer including the second material;
a first sidewall disposed on a side surface of the first line-shaped portion, the first sidewall including an oxide of the first material and covering a side surface of the first layer and a side surface of the second layer; and
a second sidewall disposed on a side surface of the second line-shaped portion, the second sidewall including the oxide of the first material and covering a side surface of the first layer and a side surface of the second layer,
wherein a configuration of a surface of the first sidewall is a wave-like configuration corresponding to the stacking of the first layer and the second layer.

9. An EUV mask, comprising:
a substrate;
a first line-shaped portion provided on the substrate, a first layer and a second layer being stacked in the first line-shaped portion, the first layer including a first material, the second layer including a second material;
a second line-shaped portion provided on the substrate, a first layer and a second layer being stacked in the second line-shaped portion, the first layer including the first material, the second layer including the second material;
a first sidewall disposed on a side surface of the first line-shaped portion, the first sidewall including an oxide of the first material and covering a side surface of the first layer and a side surface of the second layer; and
a second sidewall disposed on a side surface of the second line-shaped portion, the second sidewall including the oxide of the first material and covering a side surface of the first layer and a side surface of the second layer,
wherein the first material is silicon.

10. The EUV mask according to claim 9, wherein
the first sidewall is a continuous film covering the side surface of the first line-shaped portion, and
the second sidewall is a continuous film covering the side surface of the second line-shaped portion.

11. The EUV mask according to claim 9, wherein a portion of the first sidewall disposed on the side surface of the first layer is thicker than a portion of the first sidewall disposed on the side surface of the second layer.

12. The EUV mask according to claim 9, wherein a configuration of a surface of the first sidewall is a wave-like configuration corresponding to the stacking of the first layer and the second layer.

13. The EUV mask according to claim 9, wherein the absolute value of a difference between a thickness of the first sidewall and a thickness of the second sidewall is greater than the absolute value of a difference between a width of the first line-shaped portion and a width of the second line-shaped portion.

14. The EUV mask according to claim 13, wherein
a first region and a second region corresponding to a same patterning pattern are set, and
the first line-shaped portion is disposed inside the first region, the second line-shaped portion is disposed inside the second region, and the first line-shaped portion and the second line-shaped portion correspond to the same position of the patterning pattern.

15. The EUV mask according to claim 9, wherein the second material is molybdenum.

* * * * *